(12) United States Patent
Chao et al.

(10) Patent No.: US 8,036,399 B2
(45) Date of Patent: Oct. 11, 2011

(54) AUDIO OUTPUT APPARATUS CAPABLE OF SUPPRESSING POP NOISE

(75) Inventors: Chun-Chen Chao, Taipei (TW); Li-Chang Lai, Taipei (TW); Shih-Yuan Chang, Taipei (TW)

(73) Assignee: Twinhead International Corporation, Taipei (TW)

( * ) Notice: Subject to any disclaimer, the term of this patent is extended or adjusted under 35 U.S.C. 154(b) by 491 days.

(21) Appl. No.: 12/338,628

(22) Filed: Dec. 18, 2008

(65) Prior Publication Data

US 2010/0158270 A1    Jun. 24, 2010

(51) Int. Cl.
*H04B 15/00* (2006.01)
(52) U.S. Cl. ............... 381/94.1; 381/94.5; 381/94.7; 381/94.8; 381/94.9; 381/120; 381/123
(58) Field of Classification Search .......... 381/94.1, 381/94.5, 94.7, 94.8, 94.9, 120, 123
See application file for complete search history.

(56) References Cited

U.S. PATENT DOCUMENTS

| | | | |
|---|---|---|---|
| 6,802,018 B2 * | 10/2004 | Bormann et al. | 713/324 |
| 2004/0240918 A1 * | 12/2004 | Soman et al. | 400/76 |
| 2006/0025833 A1 * | 2/2006 | Daly | 607/55 |

* cited by examiner

*Primary Examiner* — Wai Sing Louie
(74) *Attorney, Agent, or Firm* — Potter Anderson & Corroon, LLP

(57) ABSTRACT

An audio output apparatus includes: an audio codec outputting an analog audio signal corresponding to a digital audio signal from a system controller; a switch unit having a first end coupled to the audio codec through a capacitor, and a grounded second end; and a switch controller triggered by a trigger signal to output a control signal to a control end of the switch unit such that the switch unit couples the capacitor to ground in response to the control signal. The trigger signal is generated by one of the system controller, the audio codec, and a power circuit supplying electric power to the system controller, the audio codec and the switch controller upon occurrence of a condition associated with pop noise, and is outputted to the switch controller before the pop noise is generated, such that the pop noise is conducted to ground via the switch unit.

9 Claims, 5 Drawing Sheets

US 8,036,399 B2

AUDIO OUTPUT APPARATUS CAPABLE OF SUPPRESSING POP NOISE

BACKGROUND OF THE INVENTION

1. Field of the Invention

The invention relates to an audio output apparatus, more particularly to an audio output apparatus capable of suppressing pop noise.

2. Description of the Related Art

Referring to FIGS. 1a to 1d, four circuits 11, 13, 15, 17 disclosed in Taiwanese Patent No. 275312 are shown to be capable of suppressing pop noise. The circuit 11 shown in FIG. 1a includes a bipolar junction transistor (BJT) 111 for conducting pop noise to be presented at an audio output end 12 to ground in response to a control signal. The circuit 13 shown in FIG. 1b includes a diode 131 for conducting pop noise from an audio output end 14. The circuit 15 shown in FIG. 1c includes a diode 151 for conducting pop noise from an audio output end 16 to ground. The circuit 17 shown in FIG. 1d includes diodes 171, 172 for conducting pop noise from an audio output end 18.

However, since the BJT 111 and the diodes 131, 151, 171, 172 are unidirectional, they are unable to conduct pop noise with a negative voltage. Furthermore, when the BJT 111 and the diodes 131, 151, 171, 172 are conducting, higher voltage drops are present across the BJT 111 and the diodes 131, 151, 171, 172. Such voltage drops may be amplified by a reproduction device, thereby resulting in pop noise.

SUMMARY OF THE INVENTION

Therefore, an object of the present invention is to provide an audio output apparatus that is capable of suppressing pop noise and that can overcome the aforesaid drawbacks of the prior art.

According to the present invention, an audio output apparatus comprises:

a system controller for outputting a digital audio signal;

an audio codec coupled to the system controller for receiving the digital audio signal therefrom and for outputting an analog audio signal corresponding to the digital audio signal;

a capacitor having one end coupled to the audio codec for receiving the analog audio signal therefrom;

a switch unit having a first end coupled to the other end of the capacitor, a grounded second end, and a control end for receiving a control signal, the switch unit being operable to couple the first end to the second end in response to the control signal received at the control end;

a switch controller coupled to the control end of the switch unit, the switch controller being triggered by a trigger signal to generate the control signal and outputting the control signal to the control end of the switch unit so that the other end of the capacitor is grounded via the switch unit; and a power circuit for supplying electric power to the system controller, the audio codec and the switch controller.

The trigger signal is generated by one of the system controller, the audio codec and the power circuit upon occurrence of a condition associated with pop noise, and is outputted to the switch controller before the pop noise is generated, such that the switch unit couples the other end of the capacitor to ground in response to the control signal from the switch controller and such that the pop noise is conducted to ground via the switch unit.

BRIEF DESCRIPTION OF THE DRAWINGS

Other features and advantages of the present invention will become apparent in the following detailed description of the preferred embodiment with reference to the accompanying drawings, of which:

FIGS. 4III and 4IV are timing diagrams illustrating pop noise, and the conducting duration of a switch unit of the preferred embodiment;

FIGS. 4VI, 4VII and 4VIII are timing diagrams of signals at nodes A, B, and C/D of the switch controller shown in FIG. 3; and FIG. 4IX is a timing diagram of a control signal for the switch unit of the preferred embodiment.

DETAILED DESCRIPTION OF THE PREFERRED EMBODIMENT

Figure 1A:
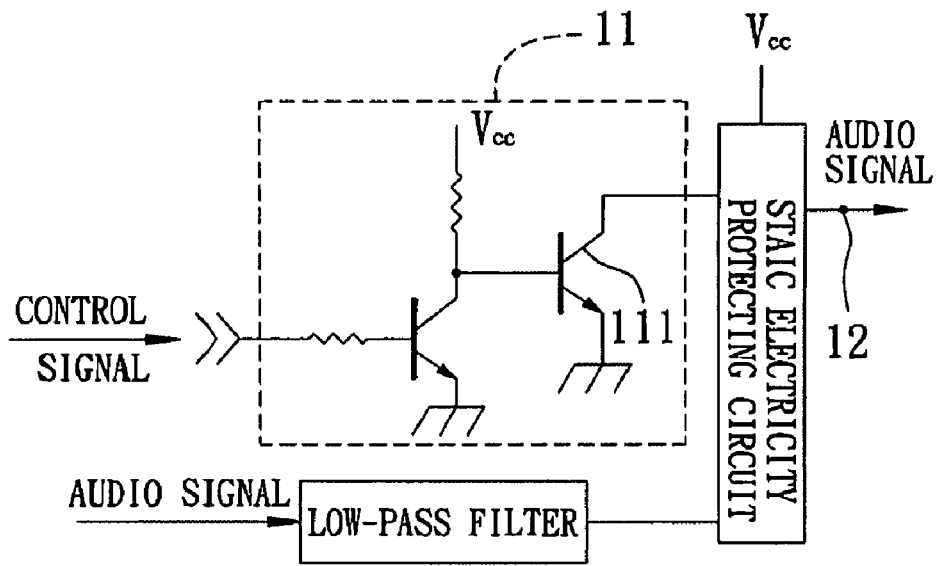
FIGS. 1a to 1d are schematic electrical circuit block diagram of conventional circuits for suppressing pop noise.
Figure 1B:
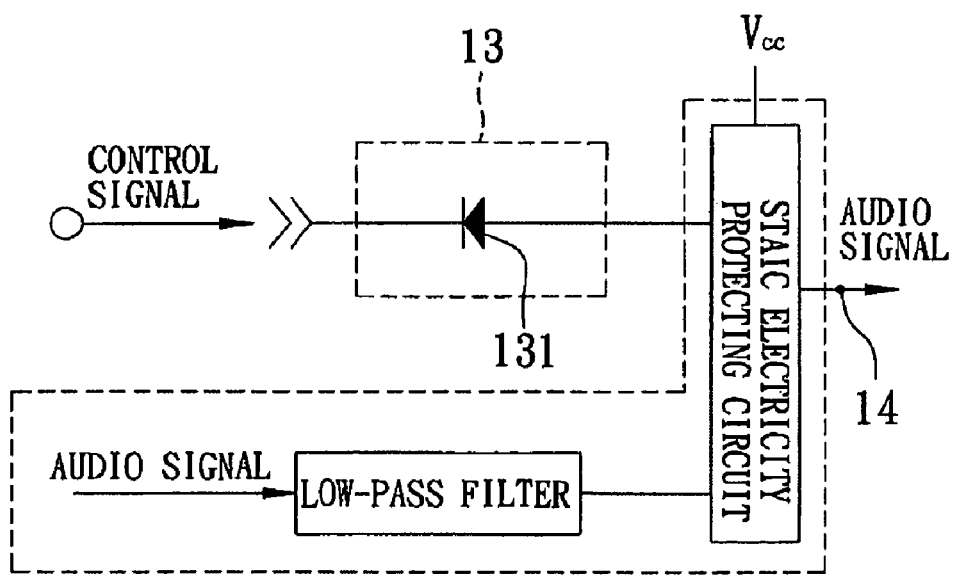
Figure 1C:
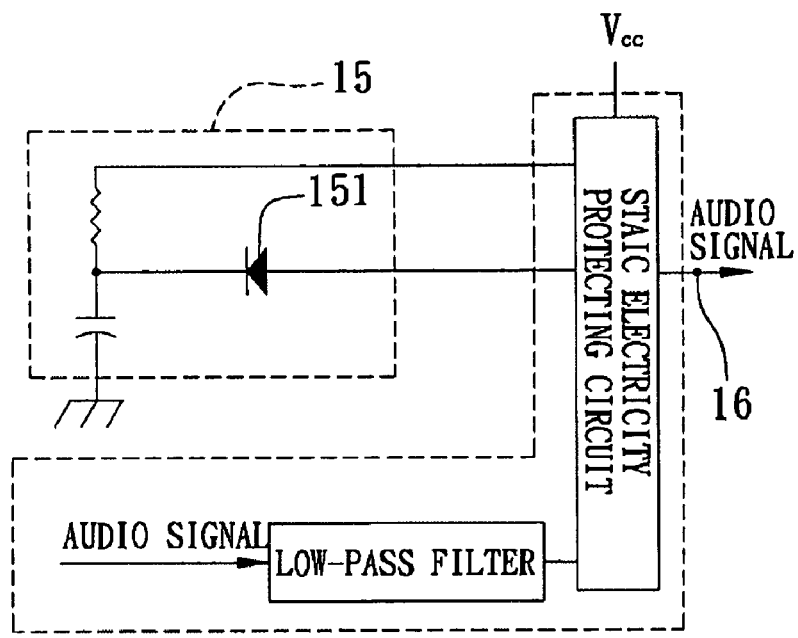
Figure 1D:
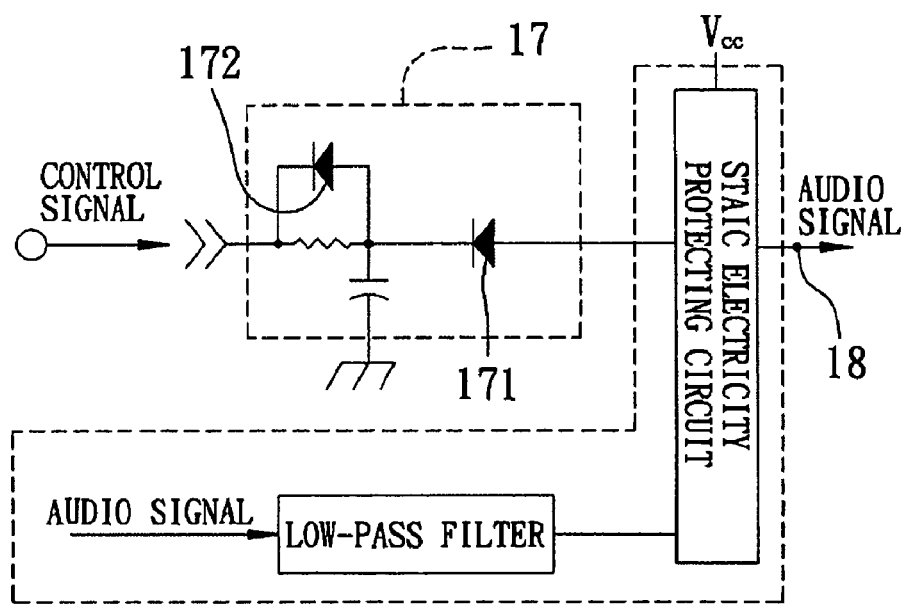
Figure 2:
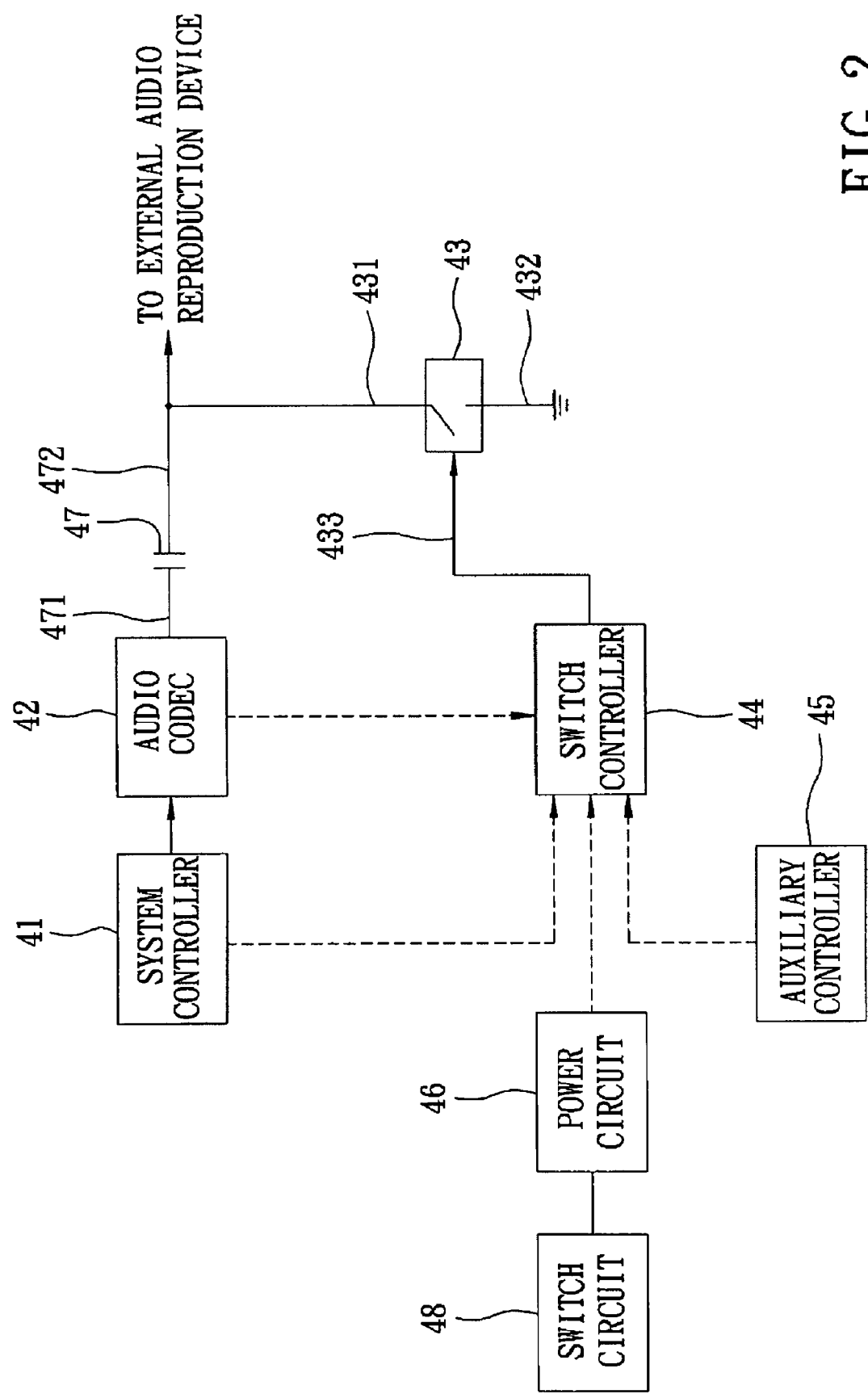
FIG. 2 is a schematic electrical circuit block diagram illustrating the preferred embodiment of an audio output apparatus according to the present invention.

Referring to FIG. 2, the preferred embodiment of an audio output apparatus according to the present invention is shown to include a system controller 41, an audio codec 42, a capacitor 47, a switch unit 43, a switch controller 44, a power circuit 46, and an auxiliary controller 45.

The system controller 41 outputs a digital audio signal.

The audio codec 42 is coupled to the system controller 41 for receiving the digital audio signal therefrom and for outputting an analog audio signal corresponding to the digital audio signal.

The capacitor 47 has one end 471 coupled to the audio codec 42 for receiving the analog audio signal therefrom, and the other end 472 adapted to be coupled to an external audio reproduction device (not shown).

The switch unit 43 has a first end 431 coupled to the other end 472 of the capacitor 47, a grounded second end 432, and a control end 433 for receiving a control signal. The switch unit 43 is operable to couple the first end 431 to the second end 432 in response to the control signal received at the control end 433.

The switch controller 44 is coupled to the control end 433 of the switch unit 43. The switch controller 44 is trigged by a trigger signal to generate the control signal, and outputs the control signal to the control end 433 of the switch unit 43 so that the other end 472 of the capacitor 47 is grounded via the switch unit 43. Preferably, the control signal is a voltage signal having a voltage not greater than 50 mV.

The power circuit 46 supplies electric power to the system controller 41, the audio codec 42 and the switch controller 44. In this embodiment, a switch circuit 48 is coupled to the power circuit 46, and is operable to switch between an ON mode and an OFF mode.

The auxiliary controller 45 is an embedded controller in this embodiment, and is coupled to the switch controller 44.

In this embodiment, the audio output apparatus is a notebook computer installed with Microsoft Windows® operating system. In other embodiments, the audio output apparatus can be a personal digital assistant, a mobile phone, a personal computer, a tablet PC or a UMPC, which can be installed with Linux or DOS operating system. For such an audio output apparatus, pop noise results from occurrence of any one of the following: the audio output apparatus is turned on; the audio output apparatus is reset; the audio output apparatus goes into a standby mode (S3); the audio output apparatus switches from the standby mode; the audio output apparatus goes into a sleep mode (S4); the audio output apparatus wakes up from the sleep mode; the audio output apparatus is abnormally shut down; and the switch circuit 48 is switched from one of the ON mode and the OFF mode to the other one of the ON mode and the OFF mode. More specifically, when the audio output apparatus is turned on, is reset, switches from the standby mode or wakes up from the sleep mode, the audio codec 42 is activated such that the capacitor 47 is charged. Thereafter, when internal functionality of the audio codec 42 is turned on, pop noise is generated. On the other hand, when the audio output apparatus goes into the standby mode, goes into the sleep node or is abnormally shut down, the internal functionality of the audio code 42 is turned off and then, the audio codec 42 is deactivated such that the capacitor 47 discharges, thereby resulting in pop noise.

It is noted that the trigger signal is generated by at least one of the system controller 41, the audio codec 42, the power circuit 46 and the auxiliary controller 45 upon occurrence of a condition associated with pop noise, and is outputted to the switch controller 44 before the pop noise is generated, such that the switch unit 43 couples the other end 472 of the capacitor 47 to ground in response to the control signal from the switch controller 44 and such that the pop noise is conducted to ground via the switch unit 43.

In this embodiment, ideally, the system controller 41 outputs the trigger signal upon occurrence of any one of the following: the audio output apparatus is turned on; the audio output apparatus is reset; the audio output apparatus switches from the standby mode; and the audio output apparatus wakes up from the sleep mode. The audio codec 42 outputs the trigger signal upon occurrence of any one of the following: the audio output apparatus goes into the standby mode; the audio output apparatus goes into the sleep mode; and the audio output apparatus is abnormally shut down. The power circuit 46 outputs the trigger signal when the switch circuit 48 is switched from one of the ON mode and the OFF mode to the other one of the ON mode and the OFF mode. As a result, the auxiliary controller 45 is optional. However, in case one of the system controller 41, the audio codec 42 and the power circuit 46 is unable to supply the trigger signal to the switch controller 44 (such as due to non-availability of a suitable pin for transmitting the trigger signal) or one of the system controller 41, the audio codec 42 and the power circuit 46 is unable to output the trigger signal at appropriate times, the auxiliary controller 45 outputs the trigger signal to the switch controller 44 upon occurrence of the condition using firmware.

Figure 3:
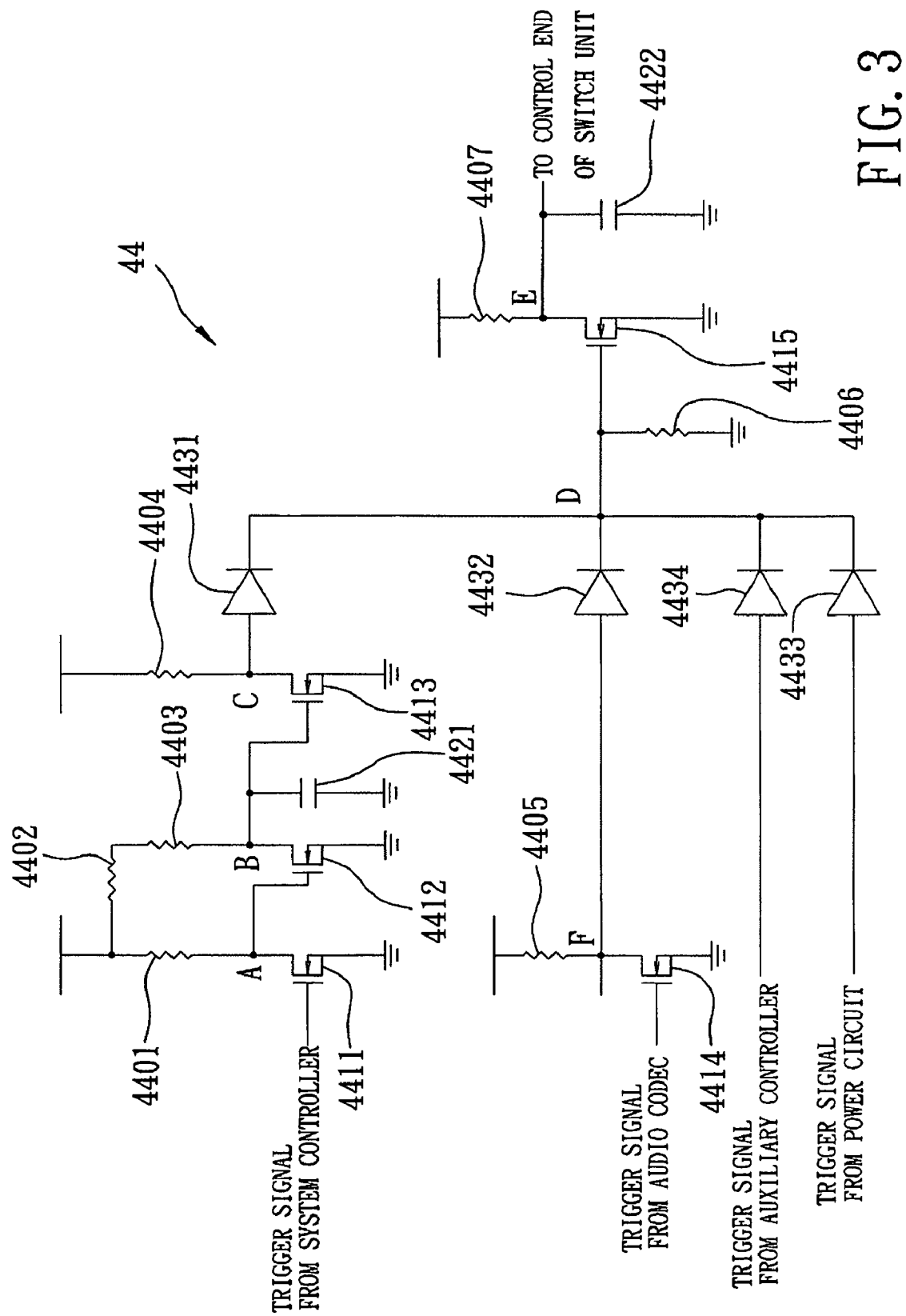
FIG. 3 is a schematic electrical circuit diagram showing a switch controller of the preferred embodiment.

Referring further to FIG. 3, in this embodiment, the switch controller 44 includes seven resistors 4401-4407, five transistors 4411-4415, two capacitors 4421, 4422, and four diodes 4431-4434, wherein: a node (A) between the resistor 4401 and the transistor 4411 is coupled to a gate of the transistor 4412; a node (B) among the resistor 4403, the transistor 4412 and the capacitor 4421 is coupled to a gate of the transistor 4413; a node (C) between the resistor 4404 and the transistor 4413 is coupled to a node (D) among cathodes of the diodes 4432, 4433, 4434, the resistor 4406, and a gate of the transistor 4415 via the diode 4431; a node (E) among the resistor 4407, the transistor 4415 and the capacitor 4422 is coupled to the control end 433 of the switch unit 43; a gate of the transistor 4411 is coupled to the system controller 41; a node (F) between the resistor 4405 and the transistor 4414 is coupled to the node (D) via the diode 4432; agate of the transistor 4414 is coupled to the audio codec 42; an anode of the diode 4433 is coupled to the power circuit 46; and an anode of the diode 4434 is coupled to the auxiliary controller 45. It is noted that the resistors 4402, 4403, 4407 and the capacitors 4421, 4422 are timing resistors and timing capacitors. The duration during which the switch unit 43 couples the other end 472 of the capacitor 47 to ground is associated with the timing resistors and the timing capacitors.

Figure 4:
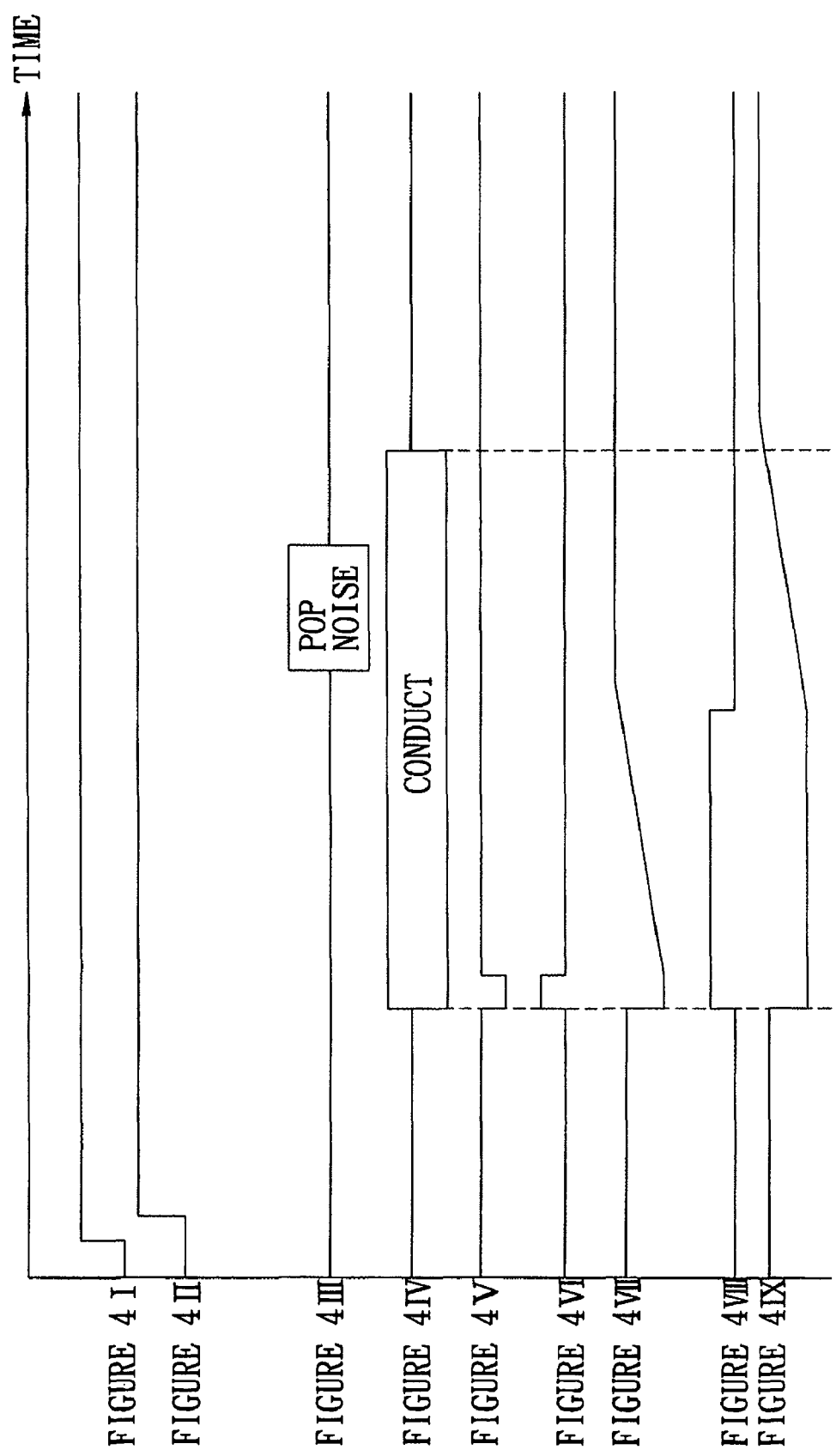
FIGS. 4I and 4II are timing diagrams of electric power signals supplied to a system controller and an audio codec of the preferred embodiment.
FIG. 4V is a timing diagram of a trigger signal for the switch controller.

Referring further to FIGS. 4I to 4IX, for example, when the audio output apparatus is turned on, an electric power signal shown in FIG. 4I is supplied to the system controller 41, and then, the audio codec 42 is activated with an electric power signal shown in FIG. 4II. Thereafter, when the audio output apparatus is reset, switches from the standby mode or switches from the sleep mode, the system controller 41 outputs the trigger signal shown in FIG. 4V to the switch controller 44 before pop noise attributed to activation of the internal functionality of the audio codec 42, as shown in FIG. 4III, is generated. As for operation of the switch controller 44, a signal at the node (A) is shown in FIG. 4VI; a signal at the node (B) is shown in FIG. 4VII; a signal at the node (C/D) is shown in FIG. 4VIII; and the control signal, i.e., a signal at the node (E), is shown in FIG. 4IX. As a result, the other end 472 of the capacitor 47 is grounded in response to the control signal from the switch controller 44 within the duration shown in FIG. 4IV. Thus, the pop noise can be effectively suppressed.

In sum, since the trigger signal is outputted to the switch controller 44 by one of the system controller 41, the audio codec 42, the power circuit 46 and the auxiliary controller 45 upon occurrence of the condition associated with pop noise, the switch controller 44 outputs the control signal to the switch unit 43 in response to the trigger signal before pop noise is generated, such that the switch unit 43 couples the other end 472 of the capacitor 47 to ground and the pop noise is conducted to ground via the switch unit 43. Thus, the audio output apparatus of the present invention can effectively prevent the pop noise from being outputted to the external audio reproduction device.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. An audio output apparatus comprising:
   a system controller for outputting a digital audio signal;
   an audio codec coupled to said system controller for receiving the digital audio signal therefrom and for outputting an analog audio signal corresponding to the digital audio signal;
   a capacitor having one end coupled to said audio codec for receiving the analog audio signal therefrom;
   a switch unit having a first end coupled to the other end of said capacitor, a grounded second end, and a control end for receiving a control signal, said switch unit being operable to couple said first end to said second end in response to the control signal received at said control end;
   a switch controller coupled to said control end of said switch unit, said switch controller being triggered by a trigger signal to generate the control signal and outputting the control signal to said control end of said switch unit so that the other end of said capacitor is grounded via said switch unit; and a power circuit for supplying electric power to said system controller, said audio codec and said switch controller;

wherein the trigger signal is generated by one of said system controller, said audio codec and said power circuit upon occurrence of a condition associated with pop noise, and is outputted to said switch controller before the pop noise is generated, such that said switch unit couples the other end of said capacitor to ground in response to the control signal from said switch controller and such that the pop noise is conducted to ground via said switch unit.

2. The audio output apparatus as claimed in claim 1, wherein said switch controller includes at least one timing resistor and at least one timing capacitor, the duration during which said switch unit couples the other end of said capacitor to ground being associated with said timing resistor and said timing capacitor.

3. The audio output apparatus as claimed in claim 1, wherein the control signal is a voltage signal having a voltage not greater than 50 mV.

4. The audio output apparatus as claimed in claim 1, further comprising an auxiliary controller for outputting the trigger signal to said switch controller upon occurrence of the condition.

5. The audio output apparatus as claimed in claim 4, wherein one of said system controller and said auxiliary controller outputs the trigger signal upon occurrence of one of the following: said audio output apparatus is turned on; said audio output apparatus is reset; said audio output apparatus switches from a standby mode; and said audio output apparatus wakes up from a sleep mode.

6. The audio output apparatus as claimed in claim 4, wherein one of said audio codec and said auxiliary controller outputs the trigger signal upon occurrence of one of the following: said audio output apparatus goes into a standby mode; said audio output apparatus goes into a sleep mode; and said audio output apparatus is abnormally shut down.

7. The audio output apparatus as claimed in claim 4, further comprising a switch circuit coupled to said power circuit and operable to switch between an ON mode and an OFF mode;

wherein one of said power circuit and said auxiliary controller outputs the trigger signal when said switch circuit is switched from one of the ON mode and the OFF mode to the other one of the ON mode and the OFF mode.

8. The audio output apparatus as claimed in claim 4, wherein said switch controller includes four diodes having cathodes coupled to each other, and anodes corresponding respectively to said system controller, said audio codec, said power circuit and said auxiliary controller.

9. The audio output apparatus as claimed in claim 4, wherein said auxiliary controller is an embedded controller.

* * * * *